(12) United States Patent
Hsin et al.

(10) Patent No.: US 7,366,642 B2
(45) Date of Patent: Apr. 29, 2008

(54) MINIMUM FORCE OUTPUT CONTROL METHOD FOR COUNTER-MASS WITH CABLE

(75) Inventors: Yi-Ping Hsin, Dublin, CA (US); Gabor D. Szoboszlay, Santa Clara, CA (US); Kazuhiro Hirano, Tokyo (JP); Kazuo Masaki, Tokyo (JP); Christopher B. Smith, San Jose, CA (US); Ryoichi Kawaguchi, Tokyo (JP); Bausan Yuan, San Jose, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 11/115,673

(22) Filed: Apr. 26, 2005

(65) Prior Publication Data

US 2006/0241873 A1   Oct. 26, 2006

(51) Int. Cl.
*G06F 15/00* (2006.01)
(52) U.S. Cl. ...................................................... 702/194
(58) Field of Classification Search ............... 702/194; 355/72, 75, 53; 434/34
See application file for complete search history.

(56) References Cited

U.S. PATENT DOCUMENTS

| | | | | |
|---|---|---|---|---|
| 5,261,819 | A * | 11/1993 | Harvey | 434/34 |
| 6,597,435 | B2 | 7/2003 | Poon et al. | |
| 6,741,332 | B2 * | 5/2004 | Nishi | 355/72 |
| 2003/0067592 | A1 * | 4/2003 | Poon et al. | 355/75 |
| 2004/0145713 | A1 * | 7/2004 | Ono | 355/53 |
| 2006/0017908 | A1 * | 1/2006 | Mayama | 355/72 |

* cited by examiner

Primary Examiner—John Barlow
Assistant Examiner—Xiuqin Sun
(74) Attorney, Agent, or Firm—Townsend and Townsend and Crew LLP

(57) ABSTRACT

Embodiments of the invention relate to a cable force feedforward approach that takes into account the cable force in the counter-mass trajectory computation to reduce or eliminate vibration of the lens body caused by the cable force disturbance and corrective force exerted by the trim motors. In one embodiment, a method provides cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage. The method comprises measuring a counter-mass position y of the counter-mass in response to forces applied to the counter-mass; measuring a cable force $f$ exerted on the counter-mass by the cable which is connected to the counter-mass; generating a cable force function $\hat{f}(y, \dot{y})$ of the measured cable force $f$ versus the counter-mass position y; and computing the trim motor output force u as $$u \cong -f + w \cdot \hat{f}(y, \dot{y}),$$

where w is a weighting function having a value from 0 to 1 and is selected for optimization.

30 Claims, 4 Drawing Sheets

MINIMUM FORCE OUTPUT CONTROL METHOD FOR COUNTER-MASS WITH CABLE

CROSS-REFERENCES TO RELATED APPLICATIONS

Not Applicable

BACKGROUND OF THE INVENTION

The present invention relates generally to a control system and method for controlling the trajectory and alignment of one or more stages in a semiconductor wafer exposure system and, more particularly, to reducing the output forces of stage counter-mass trim motors in the existence of cable force disturbances or the like.

In a conventional photolithographic process for manufacturing devices such as semiconductors and liquid crystal display devices, projection exposure apparatus of a sequential moving type such as a reduction projection exposure apparatus based on a step-and-repeat method (a so-called stepper) that reduces and transfers a pattern formed on a mask or a reticle (hereinafter generally referred to as a "reticle") onto a substrate such as a wafer or a glass plate (hereinafter generally referred to as a "wafer") coated with a resist or the like via a projection optical system, and a scanning projection exposure apparatus based on a step-and-scan method (a so-called scanning stepper), which is an improvement of the stepper, are being widely used.

For example, in a scanning stepper, a reticle stage supporting member is a movement reference of a reticle stage on which a reticle is held. And, since it plays an important part when setting an imaging plane on which an image of a pattern formed on the reticle is formed by a projection optical system, vibration of the reticle supporting member is preferably suppressed as much as possible, even when the reticle stage is being driven.

In addition, with a wafer stage of a projection exposure apparatus, in most cases a wafer table that can be driven at least in a Z tilt is arranged on an XY stage that can be driven in an XY plane in order to make the wafer surface coincide with the image plane on which the image of the pattern on the reticle is formed, and the wafer is held on the wafer table. In such cases, when vibration occurs in a wafer stage supporting member that exceeds a predetermined amount, the vibration cannot be attenuated sufficiently, which causes the control accuracy of the position of the wafer table in the Z-axis direction to decrease.

Therefore, when the reticle stage or the wafer stage is driven, such as by a linear motor, in order to keep a reaction force that occurs when the stage is driven by the linear motor from traveling to the stage supporting member, the stator of the linear motor on which the reaction force due to the drive of the stage acts is to be separated from the stage supporting member, or a so-called counter mass mechanism where the stator moves for conservation of momentum by the action of the reaction force is to be employed. With the above arrangement, the stage supporting member is isolated from vibration caused by the reaction force that occurs when the stage is driven.

Cables are connected to the counter-mass mechanism to supply power to drive the counter-mass in the opposite direction from the stage and provide cooling. The cables produce a cable force disturbance that is corrected by applying a corrective force on the counter-mass using trim motors. The reaction force will transmit to the lens body and cause vibration of the lens body. The vibration will deteriorate the exposure performance.

BRIEF SUMMARY OF THE INVENTION

Embodiments of the present invention are directed to taking into account the cable force in the counter-mass trajectory computation to reduce or eliminate vibration of the lens body caused by the cable force disturbance and corrective force exerted by the trim motors. To do so, a cable force feedforward approach is used to provide cable force identification and modeling, feedforward trajectory generation, and weighting function for optimization.

An aspect of the present invention is directed to a method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage. The method comprises measuring a counter-mass position y of the counter-mass in response to forces applied to the counter-mass; measuring a cable force $f$ exerted on the counter-mass by the cable which is connected to the counter-mass; generating a cable force function $\hat{f}(y, \dot{y})$ of the measured cable force $f$ versus the counter-mass position y; and computing the trim motor output force u as $$u \cong -f + w \cdot \hat{f}(y, \dot{y}),$$

where w is a weighting function having a value from 0 to 1 and is selected for optimization.

In some embodiments, generating a cable force function $\hat{f}(y,\dot{y})$ may comprise providing a look-up plot or table of the measured cable force $f$ versus the counter-mass position y. Generating a cable force function $\hat{f}(y, \dot{y})$ may comprise performing a curve fitting to obtain an approximate cable force as a function of the counter-mass position. The weighting function w may be set to a positive value which is approximately 0 to turn off the cable force feedforward, and the trim motor output force will substantially cancel out the cable force. The weighting function w may be set to about 1 to utilize the cable force feedforward to produce a minimum magnitude for the trim motor output force.

In specific embodiments, the method further comprises computing a center of gravity shift of the stage and counter-mass $C_g$ as $$c_g = \left(\frac{M_{CM}}{M_{CM} + m_{RS}}\right) \cdot e \cong \left(\frac{-M_{CM}}{M_{CM} + m_{RS}}\right) \cdot P * \left(w \cdot \hat{f}(y, \dot{y})\right),$$

where $M_{CM}$ is a mass of the counter-mass, $m_{RS}$ is a mass of the stage, and P is a counter-mass function representing the counter-mass position y as a function of the forces applied to the counter-mass. The counter-mass function P may be approximated by $$\left(\frac{1/M_{CM}}{s^2 + 2\zeta\omega s + \omega^2}\right).$$

The method may further comprise selecting a value for the weighting function w to achieve a desired trim motor output force u and a desired center of gravity shift $C_g$. Selecting the value for the weighting function w may comprise, for a maximum allowable center of gravity shift $C_g$, computing a maximum value for the weighting function w and setting the weighting function w to a value between 0 and the maximum value. Selecting the value for the weighting function w may comprise, for a maximum allowable trim motor output force u, computing a minimum value for the weighting function w and setting the weighting function w to a value between the minimum value and 1.

Another aspect of the invention is directed to a method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage. The method comprises measuring a counter-mass position y of the counter-mass in response to forces applied to the counter-mass; measuring a cable force $f$ exerted on the counter-mass by the cable which is connected to the counter-mass; obtaining a counter-mass function P representing the counter-mass position y as a function of the forces applied to the counter-mass; calculating a counter-mass position error e by subtracting a counter-mass trajectory $y_d$ from the measured counter-mass position y, the counter-mass trajectory $y_d$ being an ideal counter-mass position as a result of the stage reaction force r from movement of the stage, $y_d = P*r$; computing a weighted cable force feedforward trajectory x using a weighting function w as $x = w*P*f$, where w is a weighting function having a value from 0 to 1 and is selected for optimization; generating a trim motor feedback controller function K to control the one or more trim motors, the trim motor feedback controller function K representing the trim motor output force u as a function of a corrective counter-mass position; and determining the trim motor output force u by combining the counter-mass position error e and the weighted cable force feedforward trajectory x as the corrective counter-mass position, $u = K*(e+x)$.

In some embodiments, the method further comprises generating a cable force function $\hat{f}(y, \dot{y})$ of the measured cable force $f$ versus the counter-mass position y; approximating the counter-mass function P as $$\left( \frac{1/M_{CM}}{s^2 + 2\zeta\omega s + \omega^2} \right);$$

and computing the weighted cable force feedforward trajectory x as $$x = \left( \frac{1/M_{CM}}{s^2 + 2\zeta\omega s + \omega^2} \right) * (w \cdot \hat{f}(y)).$$

Another aspect of the present invention is directed to a system for providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage. The system comprises a counter-mass function module configured to provide a counter-mass function P representing a counter-mass position y as a function of forces applied to the counter-mass, the forces including the trim motor output force, the reaction force from movement of the stage, and a cable force $f$ exerted on the counter-mass by the cable which is connected to the counter-mass; a counter-mass position error module configured to calculate a counter-mass position error e by subtracting a counter-mass trajectory $y_d$ from the measured counter-mass position y, the counter-mass trajectory $y_d$ being an ideal counter-mass position as a result of the stage reaction force r from movement of the stage, $y_d = P*r$; a cable force feedforward loop configured to provide a weighted cable force feedforward trajectory x using a weighting function w as $x = w*P*f$, where w is a weighting function having a value from 0 to 1 and is selected for optimization; and a trim motor feedback controller configured to provide a trim motor feedback controller function K to control the one or more trim motors, the trim motor feedback controller function K representing a trim motor output force u as a function of a corrective counter-mass position. The trim motor feedback controller is configured to receive the corrective counter-mass position as a sum of the counter-mass position error e and the weighted cable force feedforward trajectory x to determine the trim motor output force u as $u = K*(e+x)$.

In some embodiments, the cable force feedforward loop comprises a cable force function module configured to provide a cable force function $\hat{f}(y, \dot{y})$ of the measured cable force $f$ versus the counter-mass position y; and a counter-mass model module configured to approximate the counter-mass function P as $$\left( \frac{1/M_{CM}}{s^2 + 2\zeta\omega s + \omega^2} \right).$$

The weighted cable force feedforward trajectory x is represented by $$x = \left( \frac{1/M_{CM}}{s^2 + 2\zeta\omega s + \omega^2} \right) * (w \cdot \hat{f}(y)).$$

In specific embodiments, the counter-mass position error module is configured to calculate the counter-mass position error e as $e = -P*(f+u)$, so that the trim motor output force u is $$u = \left( \frac{KP}{1 + KP} \right) * (-f + w \cdot \hat{f}(y, \dot{y}));$$

and KP is assumed to be much greater than 1 and the trim motor output force u is approximated by $$\boxed{u \cong -f + w \cdot \hat{f}(y, \dot{y})}.$$

A shift module is configured to compute a center of gravity shift of the stage and counter-mass $C_g$ as $$\boxed{c_g = \left( \frac{M_{CM}}{M_{CM} + m_{RS}} \right) \cdot e \cong \left( \frac{-M_{CM}}{M_{CM} + m_{RS}} \right) \cdot P * (w \cdot \hat{f}(y, \dot{y}))}.$$

where $M_{CM}$ is a mass of the counter-mass, $m_{RS}$ is a mass of the stage, and P is a counter-mass function representing the counter-mass position y as a function of the forces applied to the counter-mass.

DETAILED DESCRIPTION OF THE INVENTION

Figure 1:
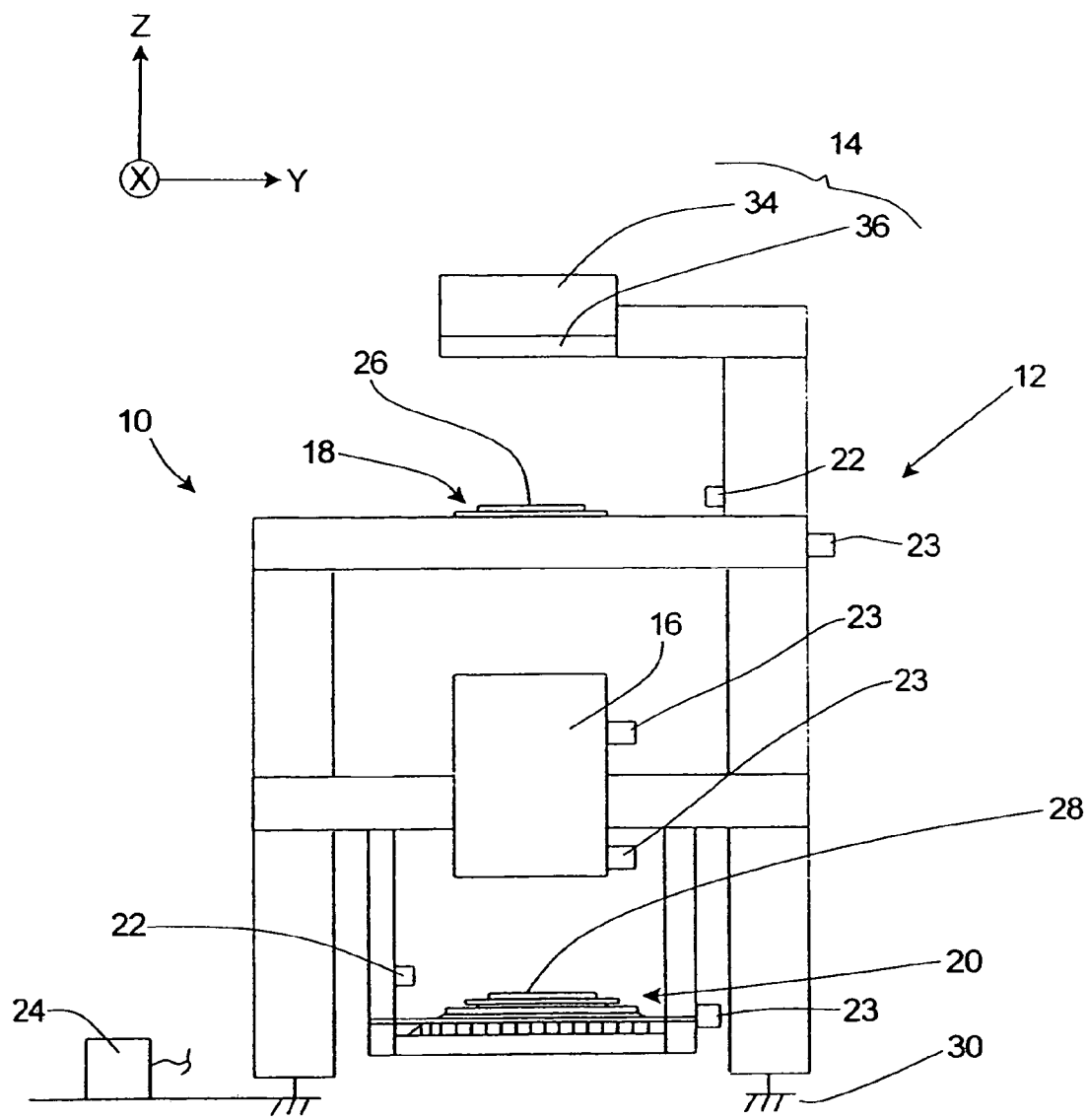
FIG. 1 is a schematic view of an exposure apparatus having features of the present invention.

FIG. 1 is a schematic illustration of a precision assembly, namely, an exposure apparatus 10. The exposure apparatus 10 includes an apparatus frame 12, an illumination system 14 (irradiation apparatus), an assembly 16 such as an optical assembly, a reticle stage assembly 18, a wafer stage assembly 20, a measurement system 22, one or more sensor 23, and a control system 24 having features of the present invention. The control system 24 may be a computer having a processor and a memory storing codes and data to be processed and executed by the processor. The specific design of the components of the exposure apparatus 10 may be varied to suit the design requirements of the particular application.

As provided herein, the control system 24 utilizes a position compensation system or module that improves the accuracy in the control and relative positioning of at least one of the stage assemblies 18, 20. An orientation system used herein includes an X axis, a Y axis which is orthogonal to the X axis, and a Z axis which is orthogonal to the X and Y axes. The X, Y, and Z axes are also referred to as first, second, and third axes. The exposure apparatus 10 is particularly useful as a lithographic device that transfers a pattern of an integrated circuit from a reticle 26 onto a semiconductor wafer 28. The exposure apparatus 10 is mounted to a mounting base 30, such as the ground, a base, a floor, or some other supporting structure.

There are different types of lithographic devices. For example, the exposure apparatus 10 may be used as a scanning type photolithography system that exposes the pattern from the reticle 26 onto the wafer 28 with the reticle 26 and the wafer 28 moving synchronously. In a scanning type lithographic device, the reticle 26 is moved perpendicularly to an optical axis of the assembly 16 by the reticle stage assembly 18 and the wafer 28 is moved perpendicularly to the optical axis of the assembly 16 by the wafer stage assembly 20. Scanning of the reticle 26 and the wafer 28 occurs while the reticle 26 and the wafer 28 are moving synchronously.

The apparatus frame 12 is rigid and supports the components of the exposure apparatus 10. As seen in FIG. 1, the apparatus frame 12 supports the assembly 16 and the illumination system 14 above the mounting base 30. The illumination system 14 includes an illumination source 34 and an illumination optical assembly 36. The illumination source 34 emits a beam (irradiation) of light energy. The illumination optical assembly 36 guides the beam of light energy from the illumination source 34 to the assembly 16. The beam illuminates selectively different portions of the reticle 26 and exposes the wafer 28. The assembly 16 is typically an optical assembly that projects and/or focuses the light passing through the reticle 26 to the wafer 28. Depending upon the design of the exposure apparatus 10, the assembly 16 can magnify or reduce the image illuminated on the reticle 26. The assembly 16 need not be limited to a reduction system, but may be a 1× or a magnification system.

The reticle stage assembly 18 holds and positions the reticle 26 relative to the assembly 16 and the wafer 28. Somewhat similarly, the wafer stage assembly 20 holds and positions the wafer 28 with respect to the projected image of the illuminated portions of the reticle 26. Movement of the stages generates reaction forces that can affect performance of the photolithography system. Typically, numerous integrated circuits are derived from a single wafer 28. Therefore, the scanning process may involve a substantial number of repetitive, identical, or substantially similar movements of portions of the reticle stage assembly 18 and/or the wafer stage assembly 20. Each such repetitive movement is also referred to herein as an iteration, iterative movement, or iterative cycle.

The measurement system 22 monitors movement of the reticle 26 and the wafer 28 relative to the assembly 16 or some other reference. With this information, the control system 24 can control the reticle stage assembly 18 to precisely position the reticle 26 and the wafer stage assembly 20 to precisely position the wafer 28 relative to the assembly 16. For example, the measurement system 22 may utilize multiple laser interferometers, encoders, and/or other measuring devices. Additionally, one or more sensors 23 can monitor and/or receive information regarding one or more components of the exposure apparatus 10. Information from the sensors 23 can be provided to the control system 24 for processing. The control system 24 also receives information from the measurement system and other systems, and controls the stage mover assemblies 18, 20 to precisely and synchronously position the reticle 26 and the wafer 28 relative to the assembly 16 or some other reference. The control system 24 includes one or more processors and circuits for performing the functions described herein.

Figure 2:
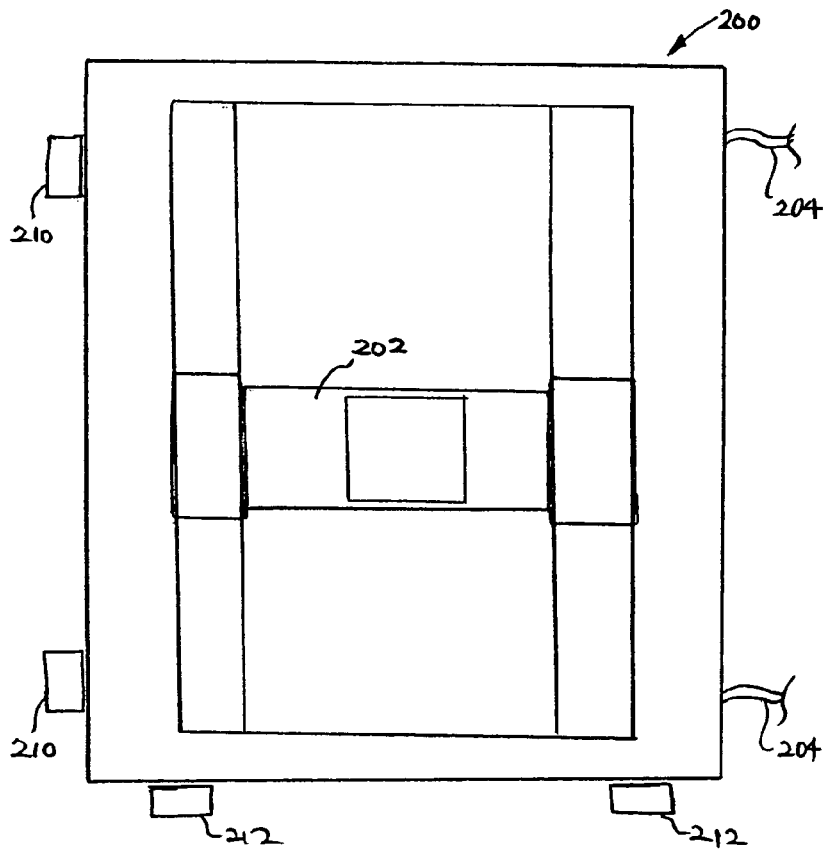
FIG. 2 is a simplified view of a counter-mass mechanism for a stage.

FIG. 2 shows a counter-mass mechanism 200 for a stage 202 such as a reticle stage (RS). FIG. 2 is a simplified schematic view of the mechanism. A more detailed example can be found in U.S. Pat. No. 6,741,332, which is incorporated herein by reference in its entirety. As seen in FIG. 2, the counter-mass mechanism 200 has one or more cables 204 connected thereto for supplying power, cooling, or the like. The counter-mass (CM) 200 is configured to move in the opposite direction from the stage 202 in response to a stage reaction force with respect to the stage movement. A plurality of trim motors are provided to adjust the movement of the counter-mass in response to the cable force disturbance from the one or more cables 204. The embodiment shown has two trim motors 210 that apply trim motor forces in the x-direction and two trim motors 212 that apply trim motor forces in the y-direction. The trim motors are typically voice coil motors (VCMs), and are attached to the lens body. The forces exerted on the counter-mass 200 include the stage reaction force from the stage 202, the cable force from the one or more cables 204, and the trim motor force from the trim motors 210, 212.

Figure 3:
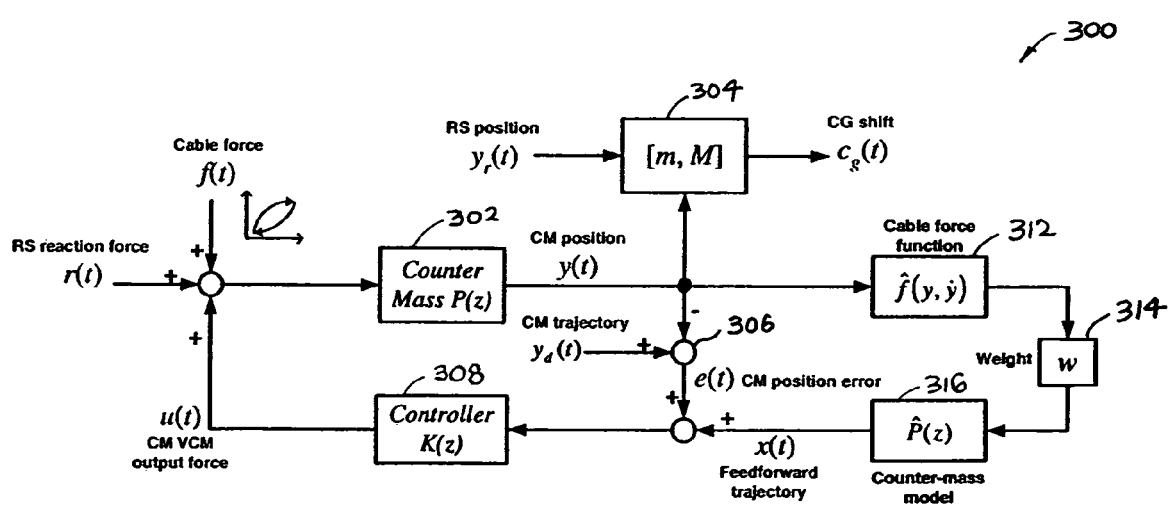
FIG. 3 is a block diagram of a control system employing a cable force feedforward scheme for a counter-mass mechanism according to an embodiment of the present invention.

FIG. 3 shows a control system 300 employing a cable force feedforward scheme for a counter-mass mechanism according to an embodiment of the present invention. The counter-mass function module P(z) 302 receives a combination of three forces: stage reaction force r(t), cable force $f$(t), and trim motor force u(t). In response to the forces, the counter-mass moves according to the CM position function y(t). The overall structure of the stage having a mass m and the counter-mass 302 having a mass M is represented as [m, M] in the shift module or block 304, which produces a center of gravity (CG) shift $C_g$(t) as a result of the CM position y(t) and the stage (RS) position $y_r$(t). At node 306, the actual CM position y(t) is subtracted from the intended or ideal CM trajectory $y_d$(t) to produce a CM position error e(t). This CM position error e(t) is used by the trim motor feedback controller K(z) 308 to control the trim motors to generate the trim motor force u(t) in the feedback loop.

In the counter-mass cable force feedforward loop, the CM position y(t) is used to estimate or predict a cable force function $\hat{f}(y, \dot{y})$ in the cable force function module 312, which is weighted by a weighting function w in the weight module 314. The weighted function is then used by a counter-mass model P(z) 316 to generate a feedforward trajectory x(t) and inputted with the CM position error e(t) to the feedback controller K(z) 308. The counter-mass force feedforward loop will be described in greater detail below.

The cable force feedforward method includes three parts: cable force identification and modeling, feedforward trajectory generation, and weighting function for optimization. The first two parts are described by referring to the feedback portion of the control system as shown in FIG. 4.

Figure 4:
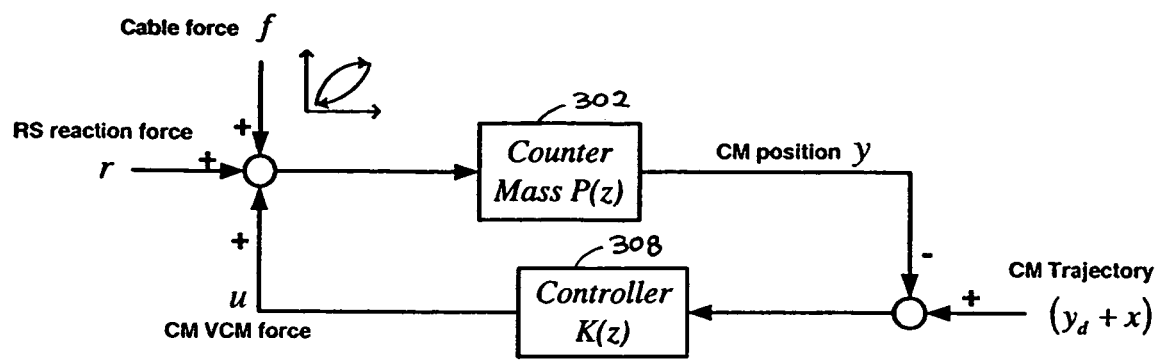
FIG. 4 is a block diagram of the feedback control portion of the control system of FIG. 3 illustrating I/O relationship and force distribution.

The counter-mass control block diagram of FIG. 4 shows the I/O relationship and force distribution. The counter-mass trajectory is the summation of the ideal CM trajectory $y_d$ and the additional feedforward trajectory x. In the ideal case, the relation between the stage reaction force r and the CM trajectory $y_d$ is $$y_d = P*r \tag{1}$$

If there is no disturbance force (e.g., cable force), i.e., $f$=0, the CM trim motor (VCM) output force u will be 0.

With the addition of cable force $f$, it is assumed at the moment that there is no additional feedforward trajectory (x=0). From the block diagram in FIG. 4, the CM trim motor output force u will be $$u = K*y_d - KP*(r+f+u) \tag{2}$$

By substituting equation (1) into equation (2) and rearranging equation (2), we obtain $$(1+KP)*u = KP*r - KP*r - KP*f \tag{3}$$

Equation (3) is rearranged to provide the relationship between the CM trim motor output force u and the joined cable force $f$ $$u = \left(\frac{-KP}{1+KP}\right)*f \tag{4}$$

If the joined cable force $f$ has the frequency component far lower than the closed-loop servo bandwidth, for example, during relative slow stage motion, the cable force $f$ can further be approximated by $$u \approx -f \tag{5}$$

Having identified the counter-mass cable force $f$, the next part of the cable force feedforward method involves feedforward trajectory generation with the goal of producing the minimum force feedforward trajectory. The additional feedforward trajectory x is solved to let the CM trim motor has zero output force.

$$u = 0 \tag{6}$$

From the block diagram in FIG. 4 with the additional feedforward trajectory x, the CM trim motor output force u becomes $$u = K*(y_d + x) - KP*(r+f+u) \tag{7}$$

Substitute equation (1) and equation (6) into equation (7), we obtain $$0 = K*x - KP*f \tag{8}$$

Then the feedforward trajectory x for zero CM trim motor output force will be $$x = P*f \tag{9}$$

For practical application, the counter-mass model $\hat{P}(z)$ is assumed to be a second-order system, and the CM mass value is known beforehand. Therefore, the feedforward trajectory x for minimum CM trim motor output force will be $$x(t) = \hat{P}(z)*f = \left(\frac{1/M_{CM}}{s^2 + 2\zeta\omega s + \omega^2}\right)*f \tag{10}$$

Figure 5:
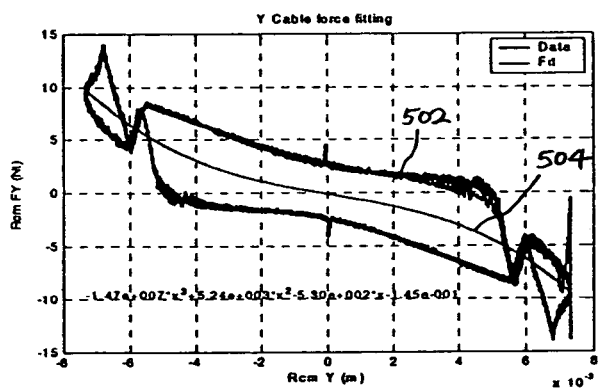
FIG. 5 is a plot of cable force versus counter-mass position for a cable according to measurement data and the cable force function obtained by curve fitting of the measurement data.

FIG. 5 shows a plot of cable force $f$ versus counter-mass position for a cable according to measurement data 502 and the curve fitted cable force function obtained by curve fitting of the measurement data 504. The feedforward trajectory x of equation (10) can be determined using the measurement data 502 or, alternatively, using the curve fitted cable force function 504 obtained by curve fitting of the measurement data. This completes the second part of the cable force feedforward method of solving for the minimum force feedforward trajectory x(t).

The third and last part of the cable force feedforward method is to apply a weighting function for optimization. The feedforward weight w is added in the cable force feedforward loop as shown in FIG. 3. For practical application, the counter-mass model $\hat{P}(z)$ is assumed a second-order system, and the CM mass value is known beforehand. The feedforward trajectory x for minimum CM trim motor output force will be $$x(t) = \left(\frac{1/M_{CM}}{s^2 + 2\zeta\omega s + \omega^2}\right)*\left(w \cdot \hat{f}(y(t))\right) \tag{11}$$

The second-order system model representation of the counter-mass model $\hat{P}(z)$ is based on well-known principles, where $\omega$ is the spring constant and $\zeta$ is the damping constant. Also, if $\hat{P}(z)=P(z)$, the CM trim motor output force u can be derived by $$u = \left(\frac{KP}{1+KP}\right) * \left(-f + w \cdot \hat{f}(y, \dot{y})\right) \quad (12)$$

The cable force is at the very-low-frequency region (KP>>1), so that equation (12) can further be approximated by $$\boxed{u \cong -f + w \cdot \hat{f}(y, \dot{y})} \quad (13)$$

The CM trim motor output u can be assumed to substantially fully cancel out the cable force ($u \cong -f$) when the cable force feedforward $\hat{f}(y, \dot{y})$ is turn off (w=0). On the other hand, when the cable force feedforward $\hat{f}(y, \dot{y})$ is fully utilized (w=1), the trim motor output will be close to minimum. The weighting function w provides a way for the operator to tune the control process to achieve the desired result.

Another feature of the control system to consider is the CM position error, which is defined as the deviation from the ideal CM trajectory.

$$e = y_d - y \quad (14)$$

In the ideal case, the relation between the stage reaction force r and the CM trajectory $y_d$ is $$y_d = P * r \quad (15)$$

In the control system 300 shown in FIG. 3, the CM position can be represented by $$y = P*(f + r + u) \quad (16)$$

Substituting equations (14) and (15) into equation (16), the CM position error as calculated in a CM position error module can be represented by $$e = -P(f+u) \quad (17)$$

By substituting equation (13) into equation (17), we obtain $$e \cong -P*(w \cdot \hat{f}(y, \dot{y})) \cong -x \quad (18)$$

Both the RS (stage) and CM (counter-mass) position errors contribute the total system CG shift. However, the scale of the RS position error is normally far less than the CM position error in real application. Also, the mass ratio between CM and RS is quite large (e.g., about 27.3 in the X6 design). Consequently, one can assume that the CM position error is the main source to be used to determine the CG shift value and that the RS position error can be ignored. The CG shift $C_g$ can be formulated from equation (8) as follows $$\boxed{c_g = \left(\frac{M_{CM}}{M_{CM}+m_{RS}}\right) \cdot e \cong \left(\frac{-M_{CM}}{M_{CM}+m_{RS}}\right) \cdot P * \left(w \cdot \hat{f}(y, \dot{y})\right)} \quad (19)$$

Equations (13) and (19) describe how the weight change w affects the trim motor output force u and the system CG shift $C_g$, respectively. When the weight w increases, the trim motor output force u decreases in magnitude and the system CG shift $C_g$ increases; when the weight w decreases, the trim motor output force u increases in magnitude and the system CG shift $C_g$ decreases.

The weighting function w can be selected to achieve the desired trim motor output force u and the desired center of gravity shift $C_g$. For a maximum allowable center of gravity shift $C_g$, one can compute a maximum value for the weighting function w and set the weighting function w to a value between 0 and the maximum value. For a maximum allowable trim motor output force u, one can compute a minimum value for the weighting function w and set the weighting function w to a value between the minimum value and 1.

Figure 6A:
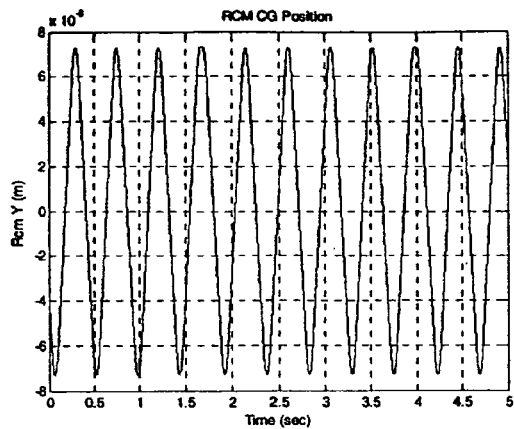
FIG. 6A is a plot of the counter-mass position versus time generated without cable force feedforward.
Figure 6B:
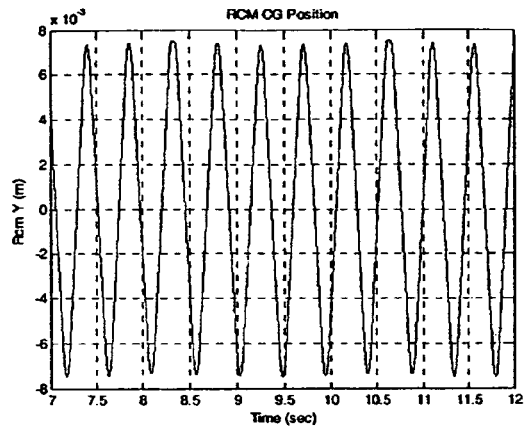
FIG. 6B is a plot of the counter-mass position versus time generated with cable force feedforward.
Figure 7A:
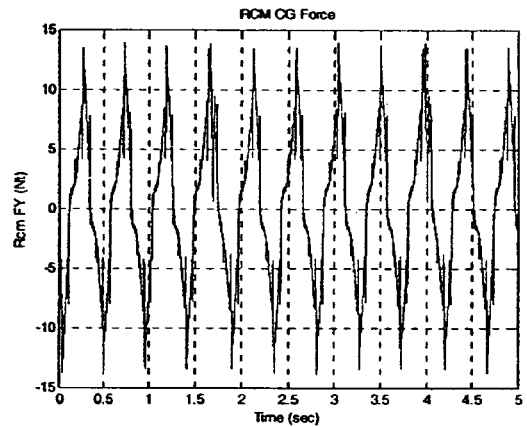
FIG. 7A is a plot of the cable force versus time generated without cable force feedforward.
Figure 7B:
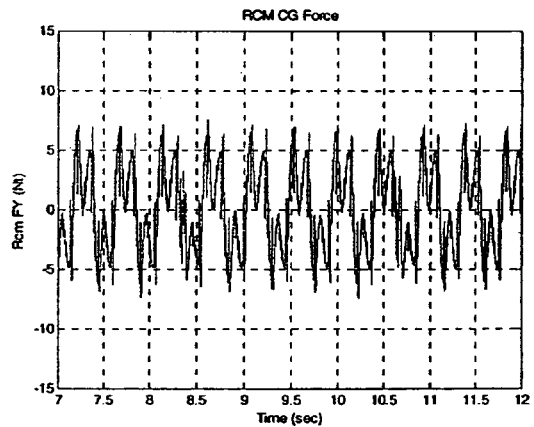
FIG. 7B is a plot of the cable force versus time generated with cable force feedforward.

FIGS. 6A-8B show comparison of simulation results for the case without cable force feedforward (i.e., w=0) and with full cable force feedforward (i.e., w=1). In FIG. 6A, the plot of the counter-mass position versus time generated without cable force feedforward shows a constant amplitude. In FIG. 6B, the counter-mass position has a variable amplitude as a result of the additional cable force feedforward. Without cable force feedforward, the plot of the cable force versus time in FIG. 7(A) has a relatively large amplitude as compared to the plot in FIG. 7(B) when cable force feedforward is used to reduce the trim motor output.

Figure 8A:
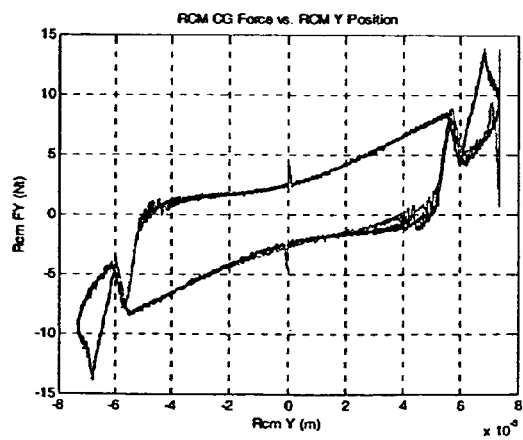
FIG. 8A is a plot of the cable force versus the counter-mass position generated without cable force feedforward.
Figure 8B:
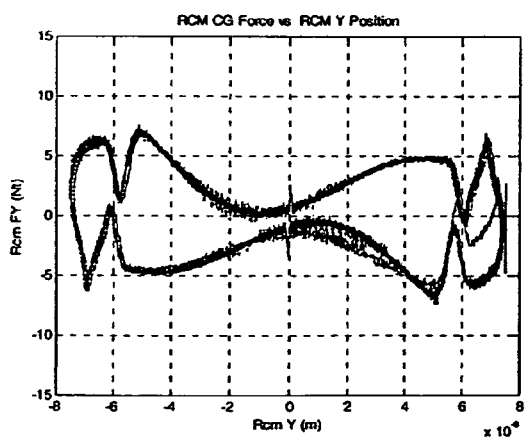
FIG. 8B is a plot of the cable force versus the counter-mass position generated with cable force feedforward.

FIG. 8A is a plot of the cable force versus the counter-mass position generated without cable force feedforward. The trim motor output will be quite large at the two end points of the counter-mass position. In contrast, the plot of the cable force in FIG. 8B shows a low cable force throughout the counter-mass position, so that the trim motor output will be relatively small.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage, the method comprising:

measuring a counter-mass position y of the counter-mass in response to forces applied to the counter-mass;

measuring a cable force $f$ exerted on the counter-mass by the cable which is connected to the counter-mass;

generating a cable force function $\hat{f}(y, \dot{y})$ of the measured cable force $f$ versus the counter-mass position y; and computing the trim motor output force u as $$\boxed{u \cong -f + w \cdot \hat{f}(y, \dot{y})},$$

where $\dot{y}$ is the time derivative of y, and w is a weighting function having a value from 0 to 1 and is selected for optimization.

2. The method of claim 1 wherein generating a cable force function $\hat{f}(y, \dot{y})$ comprises providing a look-up plot or table of the measured cable force $f$ versus the counter-mass position y.

3. The method of claim 1 wherein generating a cable force function $\hat{f}(y, \dot{y})$ comprises performing a curve fitting to obtain an approximate cable force as a function of the counter-mass position.

4. The method of claim 1 wherein the weighting function w is set to a positive value which is approximately 0 to turn off the cable force feedforward, and the trim motor output force will substantially cancel out the cable force.

5. The method of claim 1 wherein the weighting function w is set to about 1 to utilize the cable force feedforward to produce a minimum magnitude for the trim motor output force.

6. The method of claim 1 wherein the cable is connected to the counter-mass on one side portion thereon in relation to the axis that is substantially parallel to a scanning direction of the stage.

7. A method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage, the method comprising:

measuring a counter-mass position y of the counter-mass in response to forces applied to the counter-mass;

measuring a cable force $f$ exerted on the counter-mass by the cable which is connected to the counter-mass;

generating a cable force function $\hat{f}(y, \dot{y})$ of the measured cable force $f$ versus the counter-mass position y;

computing the trim motor output force u as $$u \approx -f + w \cdot \hat{f}(y, \dot{y})$$

where $\dot{y}$ is the time derivative of y, and w is a weighting function having a value from 0 to 1 and is selected for optimization; and computing a center of gravity shift of the stage and counter-mass $C_g$ as $$c_g = \left(\frac{M_{CM}}{M_{CM} + m_{RS}}\right) \cdot e \cong \left(\frac{-M_{CM}}{M_{CM} + m_{RS}}\right) \cdot P * (w \cdot \hat{f}(y, \dot{y})),$$

where $M_{CM}$ is a mass of the counter-mass, $m_{RS}$ is a mass of the stage, and P is a counter-mass function representing the counter-mass position y as a function of the forces applied to the counter-mass.

8. The method of claim 7 wherein the counter-mass function P is approximated by $$\left(\frac{1/M_{CM}}{s^2 + 2\zeta\omega s + \omega^2}\right)$$

where $\omega$ is a spring constant and $\zeta$ is a damping constant.

9. The method of claim 7 further comprising selecting a value for the weighting function w to achieve a desired trim motor output force u and a desired center of gravity shift $C_g$.

10. The method of claim 9 wherein selecting the value for the weighting function w comprises, for a maximum allowable center of gravity shift $C_g$, computing a maximum value for the weighting function w and setting the weighting function w to a value between 0 and the maximum value.

11. The method of claim 9 wherein selecting the value for the weighting function w comprises, for a maximum allowable trim motor output force u, computing a minimum value for the weighting function w and setting the weighting function w to a value between the minimum value and 1.

12. A method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage, the method comprising:

measuring a counter-mass position y of the counter-mass in response to forces applied to the counter-mass;

measuring a cable force $f$ exerted on the counter-mass by the cable which is connected to the counter-mass;

obtaining a counter-mass function P representing the counter-mass position y as a function of the forces applied to the counter-mass;

calculating a counter-mass position error e by subtracting a counter-mass trajectory $y_d$ from the measured counter-mass position y, the counter-mass trajectory $y_d$ being an ideal counter-mass position as a result of the stage reaction force r from movement of the stage, $y_d = P * r$;

computing a weighted cable force feedforward trajectory x using a weighting function w as $x = w * P * f$, where w is a weighting function having a value from 0 to 1 and is selected for optimization;

generating a trim motor feedback controller function K to control the one or more trim motors, the trim motor feedback controller function K representing the trim motor output force u as a function of a corrective counter-mass position; and determining the trim motor output force u by combining the counter-mass position error e and the weighted cable force feedforward trajectory x as the corrective counter-mass position, $u = K*(e+x)$.

13. The method of claim 12 further comprising:

generating a cable force function $\hat{f}(y, \dot{y})$ of the measured cable force $f$ versus the counter-mass position y;

approximating the counter-mass function P as $$\left(\frac{1/M_{CM}}{s^2 + 2\zeta\omega s + \omega^2}\right);$$

and computing the weighted cable force feedforward trajectory x as $$x = \left(\frac{1/M_{CM}}{s^2 + 2\zeta\omega s + \omega^2}\right) * (w \cdot \hat{f}(y)).$$

where $\omega$ is a spring constant and $\zeta$ is a damping constant.

14. The method of claim 13 wherein generating a cable force function $\hat{f}(y, \dot{y})$ comprises providing a look-up plot or table of the measured cable force $f$ versus the counter-mass position y.

15. The method of claim 13 wherein generating a cable force function $\hat{f}(y, \dot{y})$ comprises performing a curve fitting to obtain an approximate cable force as a function of the counter-mass position.

16. The method of claim 12 further comprising computing a center of gravity shift of the stage and counter-mass $C_g$ as $$c_g = \left(\frac{M_{CM}}{M_{CM} + m_{RS}}\right) \cdot e \cong \left(\frac{-M_{CM}}{M_{CM} + m_{RS}}\right) \cdot P * (w \cdot \hat{f}(y, \dot{y})),$$

where $M_{CM}$ is a mass of the counter-mass, $m_{RS}$ is a mass of the stage, and P is a counter-mass function representing the counter-mass position y as a function of the forces applied to the counter-mass.

17. The method of claim 16 further comprising selecting a value for the weighting function w to achieve a desired trim motor output force u and a desired center of gravity shift $C_g$.

18. The method of claim 17 wherein selecting the value for the weighting function w comprises, for a maximum allowable center of gravity shift $C_g$, computing a maximum value for the weighting function w and setting the weighting function w to a value between 0 and the maximum value.

19. The method of claim 17 wherein selecting the value for the weighting function w comprises, for a maximum allowable trim motor output force u, computing a minimum value for the weighting function w and setting the weighting function w to a value between the minimum value and 1.

20. The method of claim 12 wherein the cable is connected to the counter-mass on one side portion thereon in relation to the axis that is substantially parallel to a scanning direction of the stage.

21. A system for providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage, the system comprising:
a counter-mass function module configured to provide a counter-mass function P representing a counter-mass position y as a function of forces applied to the counter-mass, the forces including the trim motor output force, the reaction force from movement of the stage, and a cable force $f$ exerted on the counter-mass by the cable which is connected to the counter-mass;
a counter-mass position error module configured to calculate a counter-mass position error e by subtracting a counter-mass trajectory $y_d$ from the measured counter-mass position y, the counter-mass trajectory $y_d$ being an ideal counter-mass position as a result of the stage reaction force r from movement of the stage, $y_d$=P*r;
a cable force feedforward loop configured to provide a weighted cable force feedforward trajectory x using a weighting function w as x=w*P*$f$, where w is a weighting function having a value from 0 to 1 and is selected for optimization; and
a trim motor feedback controller configured to provide a trim motor feedback controller function K to control the one or more trim motors, the trim motor feedback controller function K representing a trim motor output force u as a function of a corrective counter-mass position;
wherein the trim motor feedback controller is configured to receive the corrective counter-mass position as a sum of the counter-mass position error e and the weighted cable force feedforward trajectory x to determine the trim motor output force u as u=K*(e+x).

22. The system of claim 21 wherein the cable force feedforward loop comprises:
a cable force function module configured to provide a cable force function $\hat{f}(y, \dot{y})$ of the measured cable force $f$ versus the counter-mass position y; and
a counter-mass model module configured to approximate the counter-mass function P as $$\left(\frac{1/M_{CM}}{s^2 + 2\zeta\omega s + \omega^2}\right),$$

wherein the weighted cable force feedforward trajectory x is represented by $$x = \left(\frac{1/M_{CM}}{s^2 + 2\zeta\omega s + \omega^2}\right) * (w \cdot \hat{f}(y))$$

where $\omega$ is a spring constant and $\zeta$ is a damping constant.

23. The system of claim 22 wherein the cable force function module is configured to generate a cable force function $\hat{f}(y, \dot{y})$ by providing a look-up plot or table of the measured cable force $f$ versus the counter-mass position y.

24. The system of claim 22 wherein the cable force function module is configured to generate a cable force function $\hat{f}(y, \dot{y})$ by performing a curve fitting to obtain an approximate cable force as a function of the counter-mass position.

25. The system of claim 22 wherein the counter-mass position error module is configured to calculate the counter-mass position error e as e=−P*($f$+u), so that the trim motor output force u is $$u = \left(\frac{KP}{1+KP}\right) * (-f + w \cdot \hat{f}(y, \dot{y}));$$

and
wherein KP is assumed to be much greater than 1 and the trim motor output force u is approximated by $u \cong -f + w \cdot \hat{f}(y, \dot{y}).$ 26. The system of claim 21 further comprising a shift module configured to compute a center of gravity shift of the stage and counter-mass $C_g$ as $$c_g = \left(\frac{M_{CM}}{M_{CM} + m_{RS}}\right) \cdot e \cong \left(\frac{-M_{CM}}{M_{CM} + m_{RS}}\right) \cdot P * (w \cdot \hat{f}(y, \dot{y})),$$

where $M_{CM}$ is a mass of the counter-mass, $m_{RS}$ is a mass of the stage, and P is a counter-mass function representing the counter-mass position y as a function of the forces applied to the counter-mass.

27. The system of claim 26 wherein the counter-mass function P is approximated by $$\left(\frac{1/M_{CM}}{s^2 + 2\zeta\omega s + \omega^2}\right)$$

where $\omega$ is a spring constant and $\zeta$ is a damping constant.

28. The system of claim 21 wherein the cable is connected to the counter-mass on one side portion thereon in relation to the axis that is substantially parallel to a scanning direction of the stage.

29. A method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage, the method comprising:

in a configuration phase:
measuring a counter-mass position y of the counter-mass in response to forces applied to the counter-mass,
measuring a cable force $f$ exerted on the counter-mass by the cable which is connected to the counter-mass, and
generating, for subsequent use, a cable force function $\hat{f}(y, \dot{y})$ of the measured cable force $f$ versus the counter-mass position y; and in a subsequent operation phase, using a control loop to compute the trim motor output force, wherein:
the control loop includes a feedback loop that is combined with a counter-mass cable force feedforward loop, and
the counter-mass cable force feedforward loop incorporates the cable force function, weighted by a weighting function w, where $\dot{y}$ is the time derivative of y, and the weighting function w has a value from 0 to 1 and is selected for optimization.

30. A method of providing cable force feedforward control for a counter-mass of a stage with a cable connected to the counter-mass and using the cable force feedforward control to control one or more trim motors to produce a trim motor output force to be applied to the counter-mass, the counter-mass moving in response to a reaction force from movement of the stage, the method comprising:

generating a cable force feedforward function $\hat{f}(y, \dot{y})$ based on a plurality of measured cable forces $f$ exerted on the counter-mass by the cable which is connected to the counter-mass, the measured cable forces corresponding to a plurality of counter-mass positions y; and during subsequent operation, computing the trim motor output force u as $$u \cong -f + w \cdot \hat{f}(y, \dot{y}).$$

where $\dot{y}$ is the time derivative of y, and w is a weighting function having a value from 0 to 1 and is selected for optimization.

* * * * *